United States Patent [19]

Keown

[11] Patent Number: 5,153,456

[45] Date of Patent: Oct. 6, 1992

[54] TTL OUTPUT BUFFER WITH TEMPERATURE COMPENSATED $V_{oh}$ CLAMP CIRCUIT

[75] Inventor: Susan M. Keown, Portland, Me.

[73] Assignee: National Semiconductor Corporation, Santa Clara, Calif.

[21] Appl. No.: 678,743

[22] Filed: Apr. 1, 1991

[51] Int. Cl.[5] .......................................... H03K 17/16
[52] U.S. Cl. .................................. 307/443; 307/456; 307/296.6
[58] Field of Search ...................... 307/296.6, 456, 443, 307/542.1

[56] References Cited

U.S. PATENT DOCUMENTS 4,975,603 12/1990 Wise et al. ........................... 307/443
5,036,224 7/1991 Wendell .............................. 307/443
5,045,724 9/1991 Ovens et al. ........................ 307/443

OTHER PUBLICATIONS

Analysis and Design of Analog Integrated Circuits, by Paul R. Gray and Robert G. Meyer, Second Edition, John Wiley & Sons, 1984. Particular reference is made to Chapter 4, "Transistor Current Sources and Active Loads", Section A4.3.2 on Band Gap Referenced Biasing Circuits, pp. 289-296 and Section 4.2.2 on Widlar Current Source.

Primary Examiner—Eugene R. Laroche
Assistant Examiner—R. A. Ratliff
Attorney, Agent, or Firm—Richard C. Calderwood; Daniel H. Kane

[57] ABSTRACT

A $V_{OH}$ clamp circuit reduces propagation delay time $TP_{HL}$ and reduces ground bounce noise in TTL output buffer circuits. First and second band gap bias generators (BG1,BG2) coupled in series provide a substantially stable clamp reference voltage level ($V_R$) over a specified range of operating temperatures. The clamp reference voltage level ($V_R$) is referenced to the low potential power rail (GND). Voltage drop components (D32,QC) of the $Y_{OH}$ clamp circuit couple the reference voltage level ($V_R$) through the voltage drop components (D32,QC) to an internal node, namely the base node (BDAR) of the pullup Darlington configuration transistor pair (Q12A,Q12B), The $V_{OH}$ clamp circuit clamps the high potential level output signal ($V_{OH}$) at a maximum voltage level ($V_{OHMAX}$) less than the high potential level power rail ($V_{cc}$), and referenced to the clamp reference voltage level ($V_R$). The band gap bias generator circuit (BG1,BG2) establishes a substantially stable clamp reference voltage level ($V_R$) approximately equal to the output signal maximum voltage level ($V_{OHMAX}$). The $V_{OH}$ clamp circuit voltage drop components (D32,QC) establish a step up voltage drop approximately equal to the step down voltage drop across the pullup Darlington transistor pair (Q12A,Q12B).

19 Claims, 5 Drawing Sheets

TTL OUTPUT BUFFER WITH TEMPERATURE COMPENSATED $V_{oh}$ CLAMP CIRCUIT

TECHNICAL FIELD

This invention relates to TTL output buffer circuits for transmitting TTL logic signals of high and low potential levels. The invention provides a new temperature compensated $V_{OH}$ clamp circuit which clamps the high potential level output signals at a maximum high potential level $V_{OHMAX}$ to reduce propagation delay time $TP_{HL}$ and improve switching speed from logic high to low potential levels at the output and to reduce ground bounce noise.

BACKGROUND ART

Figure 1:
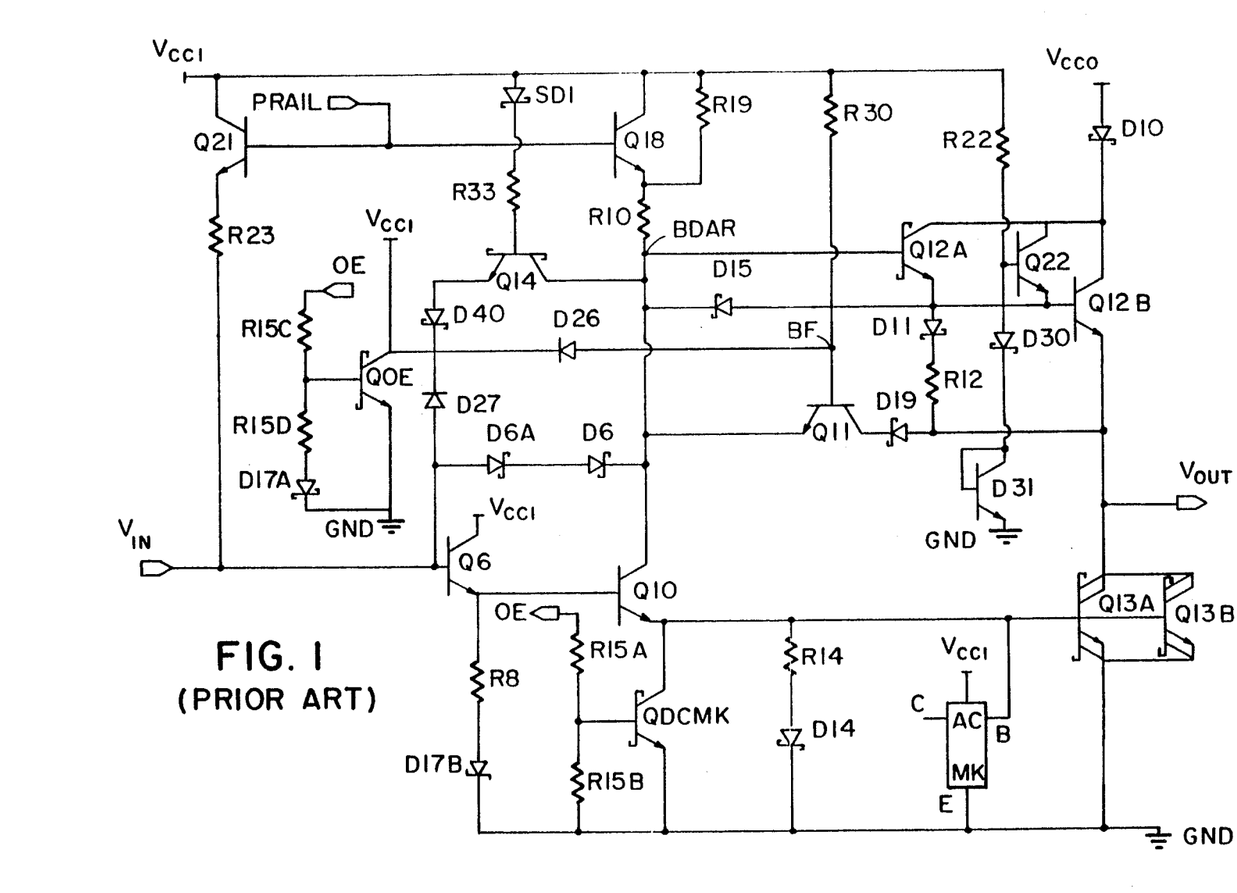
FIG. 1 is a schematic circuit diagram of a standard TTL output buffer circuit without a $V_{OH}$ clamp circuit.

A standard TTL inverting output buffer circuit useful as a line driver, for example in eight bit latched transceivers, is illustrated in FIG. 1. TTL input signals of high and low potential levels received at the input $V_{IN}$, propagate through internal nodes of the output buffer circuit and are inverted and transmitted at the output $V_{OUT}$. The pullup transistor element is provided by Darlington configuration transistor pair Q12A, Q12B which sources current to the output $V_{OUT}$ from the high potential level output supply rail $V_{CCO}$ through Schottky diode D10 for transmitting high potential level output signals $V_{OH}$.

The pulldown transistor element is provided by parallel transistors Q13A, Q13B which sink current from the output $V_{OUT}$ to the low potential level output ground rail GND for transmitting low potential level output signals $V_{OL}$. The pullup and pulldown transistor elements are controlled in opposite phase by phase splitter transistor element Q10 having a collector node coupled to the base node BDAR of the Darlington transistor element Q12A and having an emitter node coupled to the base node of the pulldown transistor element Q13A, Q13B.

The phase splitter transistor element Q10 is coupled to the input $V_{IN}$ through an overdrive and clamp input circuit provided by emitter follower input transistor element Q6 and external clamp diode elements D6A and D6 coupled between the base node of the input emitter follower transistor element Q6 and the collector node of phase splitter transistor element Q10. Q6 provides base drive "overdrive" current for rapid turn on of the phase splitter transistor element Q10. External clamp diodes D6A, D6 clamp the operation of the phase splitter transistor element Q10 out of deep saturation and, for example, in the threshold or soft saturation operation regions for rapid turn off. The collector node of phase splitter Q10 is coupled to the internal high potential level supply rail $V_{CCI}$ through resistors R10,R19 and the pseudorail circuit provided by emitter follower transistor elements Q18,Q21, controlled by pseudorail bus PRAIL. The input $V_{IN}$ is similarly coupled to the internal supply rail $V_{CCI}$ through resistor R23 and the pseudorail circuit. The emitter node of emitter follower input transistor element Q6 is coupled to the low potential power rail GND through a stack of voltage drop component elements R8, D17B.

To accelerate transition from high to low potential level at the output $V_{OUT}$, the output buffer circuit incorporates a feedback transistor element Q11 and associated feedback and buffer circuit components elements D19, R12, D11 and R30. The feedback transistor element Q11 is coupled through Schottky diode D19 between the output $V_{OUT}$ and the collector node of phase splitter transistor element Q10 to accelerate turn off of the pulldown transistor element Q13A, Q13B. The stack of voltage drop components R14, D14 at the emitter node of phase splitter transistor element Q10 provide a squaring network at the base node of the pulldown transistor element Q13A, Q13B.

The output buffer circuit of FIG. 1 is a tristate circuit for holding a high impedance third state at the output $V_{OUT}$ in response to a high potential level output enable OE signal. OE transistor element QOE and associated circuit components R15C, R15D, D17A, D27, D26, D40, Q14, D15, R33, hold off the Darlington transistor pair Q12A, Q12B, feedback transistor element Q11, phase splitter transistor element Q10, and input transistor element Q6 in response to an OE high potential level signal. A DC Miller killer circuit is provided by DC Miller killer transistor element QDCMK and associated components R15A, R15B which holds off the pulldown transistor element Q13A,Q13B during the tristate.

Other standard features of the circuit of FIG. 1 include an anti-undershoot or undershoot correcting circuit R22,Q22,D30,D31, and an AC Miller killer circuit ACMK.

Figure 2:
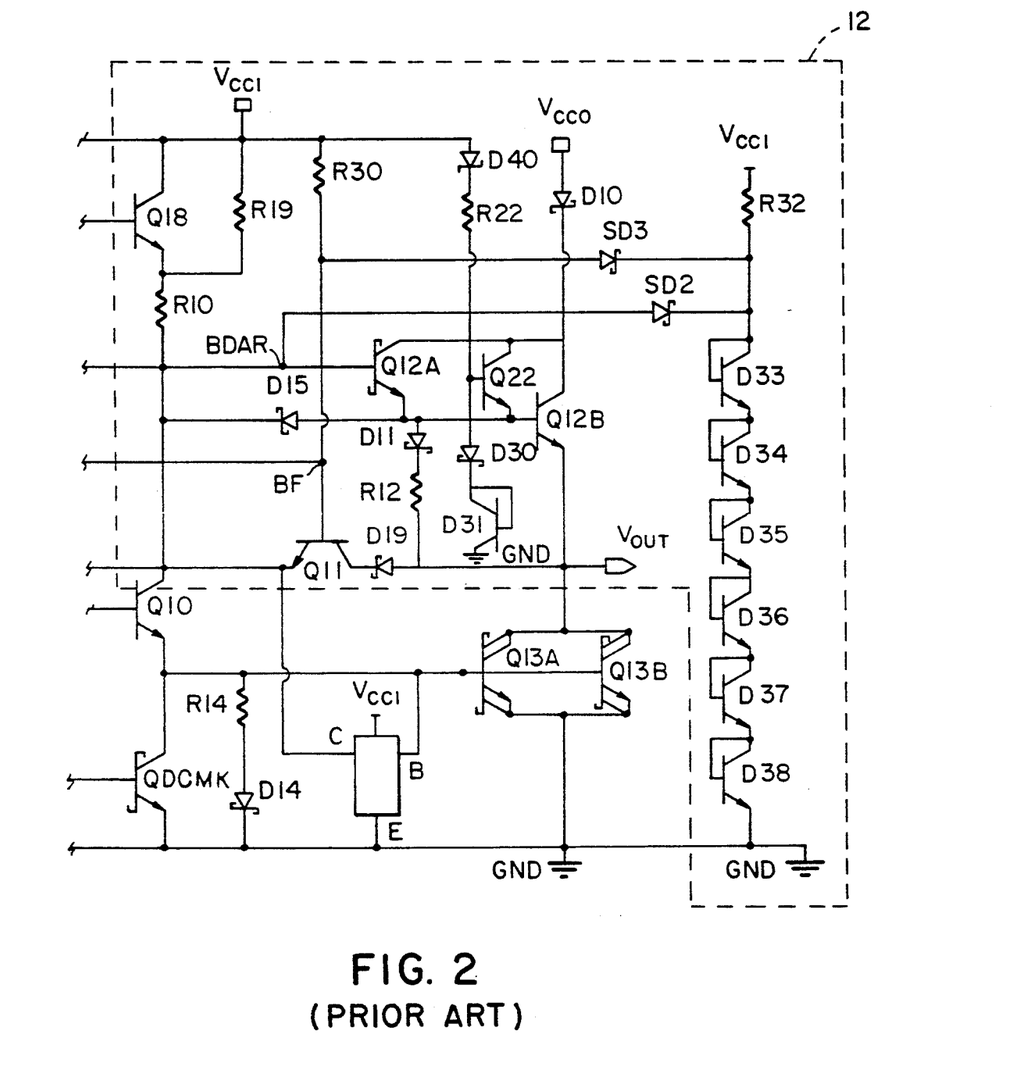
FIG. 2 is a fragmentary schematic circuit diagram of the standard TTL output buffer circuit with the addition of a prior art 6 $V_{BE}$ clamp circuit at the base node of the pullup transistor element.

A disadvantage of the circuit of FIG. 1 is that the high potential level output signal $V_{OH}$ is referenced to the output supply $V_{CCO}$ which may vary, for example, as much as 1 volt or more. With the $V_{OH}$ pulled to a higher potential level, the propagation delay for transition from high to low potential level at the output is increased. Furthermore, because of additional charge stored in the output capacitance, ground bounce noise also increases. In an effort to restore switching speed and reduce ground bounce, a $6V_{BE}$ clamp circuit D33-D38 has been coupled between the base node BDAR of the Darlington transistor element Q12A,Q12B and the ground rail GND as illustrated in FIG. 2. This $V_{OH}$ clamp circuit clamps the high potential output signal $V_{OH}$ level at a maximum voltage level and also references $V_{OH}$ to the ground rail GND. A disadvantage of the circuit of FIG. 2 however is that it is temperature sensitive and is effective only at hot temperatures.

OBJECTS OF THE INVENTION

It is therefore an object of the present invention to provide a new $V_{OH}$ clamp circuit for clamping the high potential level output signal $V_{OH}$ of a TTL output buffer circuit at a maximum voltage level $V_{OHMAX}$ to increase switching speed, reduce propagation delay time $TP_{HL}$, and reduce ground bounce noise.

Another object of the invention is to provide a $V_{OH}$ clamp circuit incorporated in a TTL output buffer circuit which is temperature compensated for providing a substantially stable clamp reference voltage level $V_R$ over a specified range of operating temperatures.

A further object of the invention is to provide a $V_{OH}$ clamp circuit for use in a TTL output buffer circuit which incorporates a feedback transistor element and temperature compensated feedback clamp circuit for accelerated transition from high to low potential at the output. The invention is also intended for use in tristate output buffer circuits and output buffer circuits incorporating other standard features.

DISCLOSURE OF THE INVENTION

In order to accomplish these results the invention provides an improved TTL output buffer circuit having pullup transistor means coupled to an output for sourcing current from a high potential level power rail and for transmitting a high potential level output signal at the output in response to TTL input signals propagating through internal nodes of the output buffer circuit. A temperature compensated clamp reference voltage level circuit provides a substantially stable clamp reference voltage level over a specified range of operating temperatures. The clamp reference voltage level is referenced to the low or ground potential power rail.

According to the invention, voltage drop components of a $V_{OH}$ clamp circuit couple the clamp reference voltage level through the voltage drop components to an internal node of the output buffer circuit. The $V_{OH}$ clamp circuit clamps the high potential level output signal at a maximum voltage level less than the high potential level power rail and with reference to the clamp reference voltage level.

In the preferred example, the temperature compensated clamp reference voltage level circuit is a band gap bias generator circuit constructed to establish a substantially stable clamp reference voltage level approximately equal to the desired maximum voltage level for the high potential level output signal $V_{OH}$. The $V_{OH}$ clamp circuit is coupled to a base node of the pullup transistor element. The voltage drop components of the $V_{OH}$ clamp circuit establish a step up voltage difference from the clamp reference voltage level to the base node of the pullup transistor element approximately equal to the step down voltage drop across the pulldown transistor element to the output. The substantially stable clamp reference voltage level is therefore applied at the output as the maximum voltage level clamp for the high potential level output signal $V_{OH}$.

According to another feature of the invention, a feedback transistor element is coupled between the output of the buffer circuit and the collector node of the phase splitter transistor element. A feedback clamp circuit of at least one voltage drop component couples the base node of the feedback transistor element to the band gap bias generator circuit clamp reference voltage level. The feedback clamp circuit establishes a feedback clamp voltage at the base node of the feedback transistor element less than the clamp voltage level at the base node of the pullup transistor element.

In the preferred example the clamp reference voltage band gap bias generator circuit is provided by first and second band gap bias generators coupled in series. The two band gap bias generators therefore establish a temperature compensated and substantially stable clamp reference voltage level at a potential of approximately 2 band gaps above the ground potential power rail. The voltage drop components of the $V_{OH}$ clamp circuit establish a $2\phi$ step up voltage drop matching the $2\phi$ step down voltage drop across a pullup Darlington transistor pair.

Other objects, features and advantages of the invention are apparent in the following specification and accompanying drawings.

DESCRIPTION OF PREFERRED EXAMPLE EMBODIMENTS AND BEST MODE OF THE INVENTION

Figure 3:
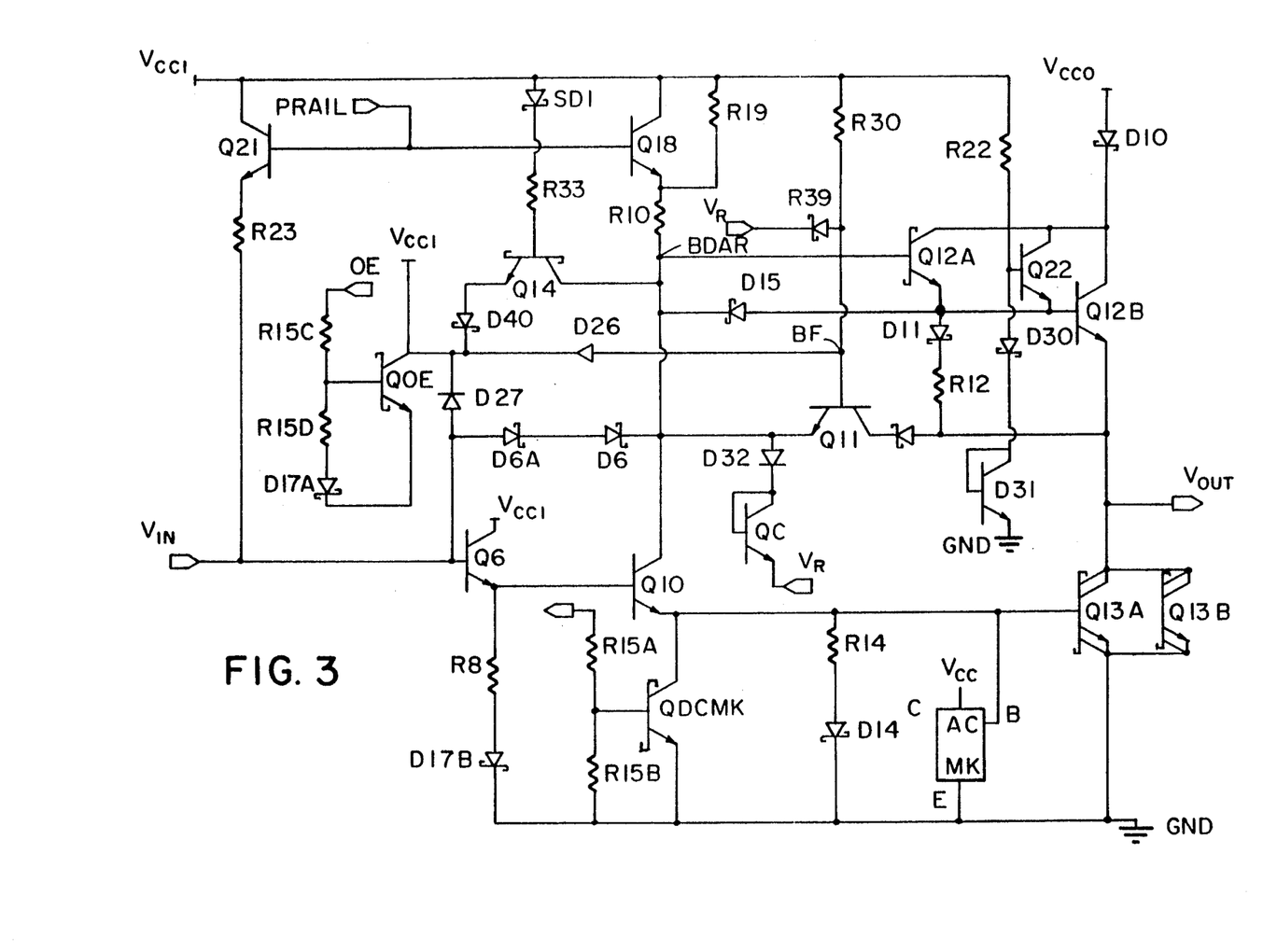
FIG. 3 is a schematic circuit diagram of a TTL output buffer circuit incorporating the $V_{OH}$ clamp circuit according to the invention.

A TTL output buffer circuit incorporating the $V_{OH}$ clamp circuit of the present invention is illustrated in FIG. 3. Circuit components performing the same or similar functions as the circuit components of the output buffer circuit of FIG. 1 are identified by the same reference designations. As shown in FIG. 3, the $V_{OH}$ clamp circuit includes voltage drop components D32, a pn junction diode, and QC, a base collector shorted (BCS) transistor element providing another pn diode junction voltage drop. The voltage drop across the voltage drop components is therefore approximately $2\phi$ or $2V_{BE}$ where $\phi$ and $V_{BE}$ are the designations for a voltage drop across a pn junction, approximately, for example, 0.8 v.

The $V_{OH}$ clamp circuit voltage drop components D32 and QC couple a temperature compensated clamp reference voltage level or source $V_R$ to the base node BDAR of the Darlington transistor pair pullup transistor element Q12A. The step up voltage drop from $V_R$ to BDAR is therefore $2\phi$. The step down voltage drop across the pullup Darlington transistor pair Q12A,Q12B from the base node BDAR to the output $V_{OUT}$ is also $2\phi$. The $V_{OH}$ clamp circuit therefore applies the temperature compensated clamp reference voltage level $V_R$ at the output $V_{OUT}$ when the pullup Darlington transistor pair is conducting. The high potential level output signal $V_{OH}$ applied at the output is clamped at a maximum voltage level $V_{OHMAX}$ equal to the temperature compensated clamp reference voltage level $V_R$.

At the same time a feedback clamp circuit incorporating a Schottky diode D39 couples the base node BF of the feedback transistor element Q11 to the clamp reference voltage level $V_R$. The voltage drop across the Schottky diode voltage drop component is approximately 0.6 v. The feedback clamp circuit therefore applies a feedback clamp voltage level $V_R + V_{SD}$ at the base node BF of the feedback transistor element Q11 which is less than the pullup clamp voltage level $V_R + 2\phi$ at the base node BDAR of pullup transistor element Q12A. The voltage level at the base node BF therefore cannot exceed the voltage level at base node BDAR for proper operation of the output buffer circuit in the DC state.

Figure 4:
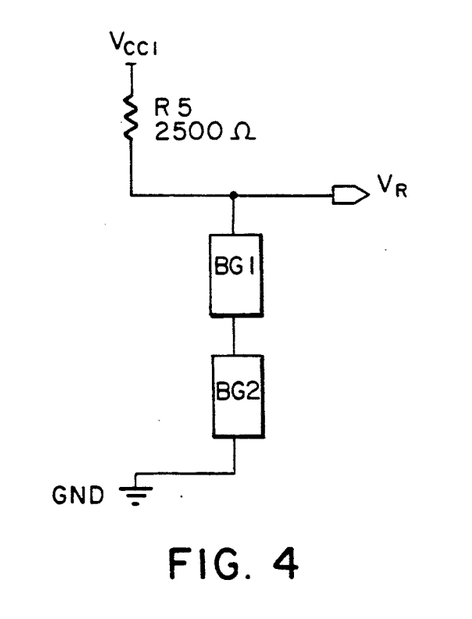
FIG. 4 is a block diagram of the band gap bias generator circuit of first and second band gap bias generators for establishing the temperature compensated and substantially stable clamp reference voltage level $V_R$.

The temperature compensated clamp reference voltage level circuit is illustrated generally in the block diagram of FIG. 4. The temperature compensated clamp reference voltage level $V_R$ is established by a band gap bias generator circuit consisting of first and second band gap bias generators BG1,BG2 coupled in series between the clamp reference voltage level $V_R$ node and the low potential power rail GND. The series coupled band gap generators BG1,BG2 are coupled to the internal high potential supply rail $V_{CC1}$ through resistor R5.

Figure 5:
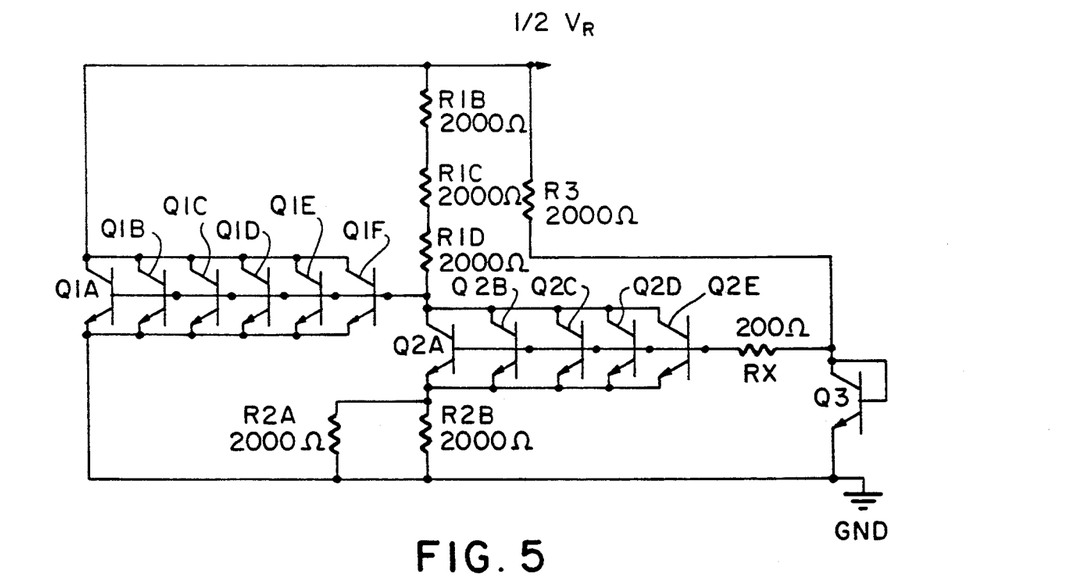
FIG. 5 is a detailed schematic circuit diagram of one of the band gap bias generators of FIG. 4.

The band gap generator circuit for each of the band gap generators BG1,BG2 is shown in detail in FIG. 5. As band gap generator circuit analysis shows, each of the band gap generators generates a temperature compensated band gap voltage of approximately 1.3 v equal to one half the clamp reference level or $\frac{1}{2}V_R$. The stack of two band gap generators in series provides a clamp reference voltage level $V_R$ of approximately 2.6 v. For a high potential level output signal $V_{OH}$ specification in the range of 2.4 v−2.7 v, the stack of two band gap generators therefore provides the closest band gap multiple to the high potential output signal voltage level specification. The voltage drop components of the $V_{OH}$ clamp circuit match the voltage drop across the pullup Darlington transistor pair and therefore apply the band gap multiple voltage $V_R$ as the maximum high potential level clamp voltage level $V_{OHMAX}$ at the output $V_{OUT}$.

Figure 6:
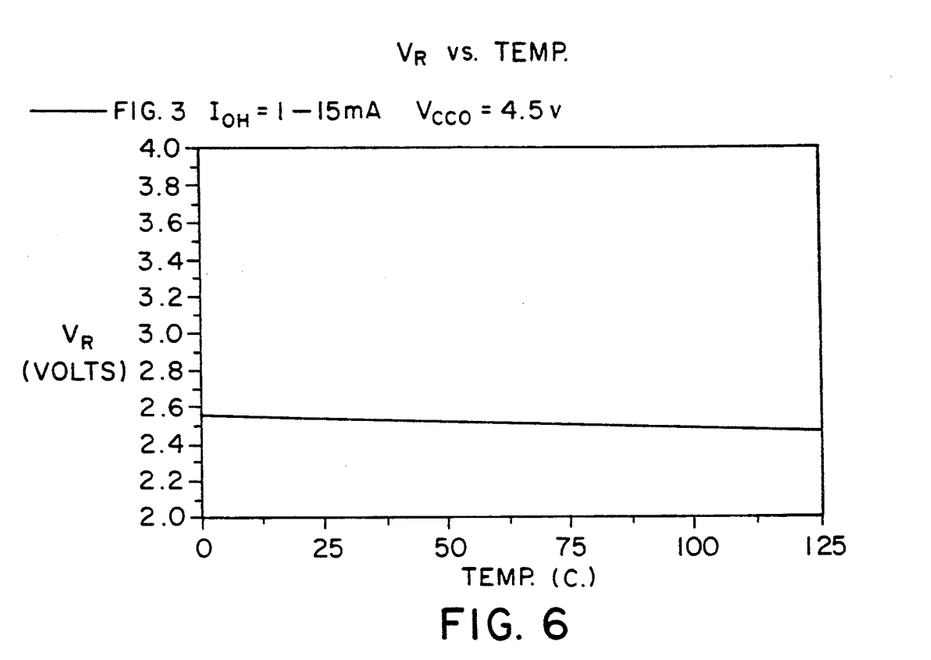
FIG. 6 is a graph showing the stability of the clamp reference voltage level $V_R$ or $V_{OHMAX}$ over a specified range of operating temperatures.
Figure 7:
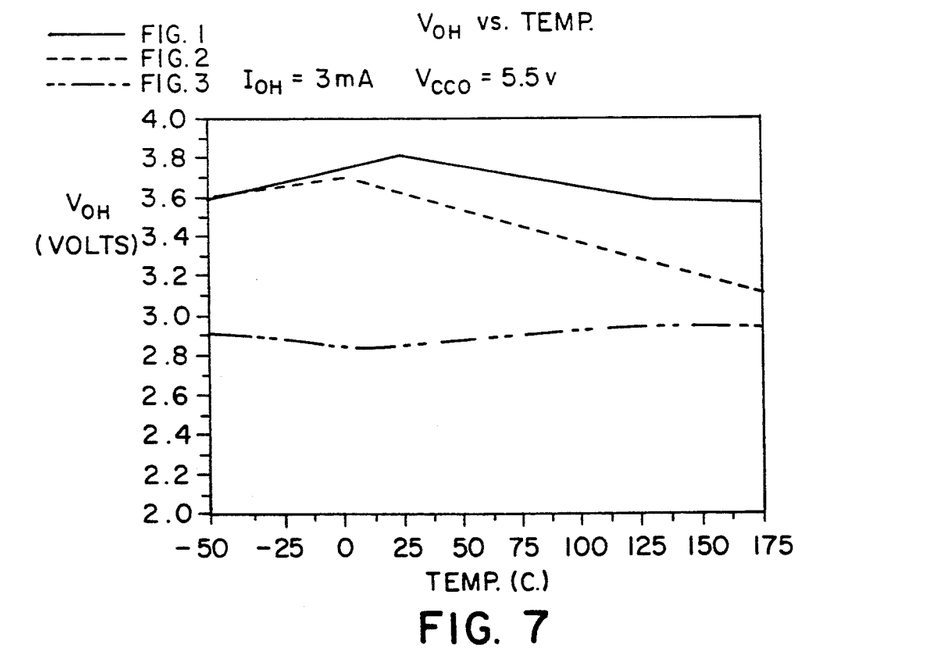
FIG. 7 is a graph comparing the stability of the high potential level output signal $V_{OH}$ of the circuit of FIG. 3 with the prior art circuits of FIGS. 1 and 2.

A preferred example band gap bias generator for each of the band gap bias generators BG1,BG2 is illustrated in FIG. 5. The band gap bias generator circuit of FIG. 4 with the stack of two band gap generators BG1,BG2 each as shown in FIG. 5, provides a low power dissipation clamp reference voltage level. The effect of the negative temperature coefficient of the constituent pn junctions is minimized in the band gap circuit coupling arrangement providing a substantially stable clamp reference voltage level $V_R = V_{OHMAX}$ for a range of output load currents $I_{OH}$. The clamp reference voltage level $V_R$ is substantially stable across the specified operating temperature range from 0° C. to 125° C. as illustrated in the graph of FIG. 6. In the example of FIG. 6 the high potential level supply rail $V_{CCO}$ is at 4.5 v. For a high potential level supply rail $V_{CCO}$ of 5.5 v the stability of the output signal high potential level $V_{OH}$ is compared with the range of values of $V_{OH}$ for the prior art circuits of FIGS. 1 and 2 in the graph of FIG. 7. The $V_{OH}$ clamp circuit of FIGS. 3–5 provides a stable $V_{OHMAX}$ clamp reference voltage for "n" output buffers, applicable, for example, in an 8 bit latched transceiver.

Design criteria for the preferred example band gap bias generators BG1,BG2 as illustrated in FIG. 5 are as follows. The transistor Q3 in the band gap bias generator of FIG. 5 is selected and sized for the low emitter current density range of, for example, 17 $\mu A/\mu^2$ with the smallest practicable emitter area of, for example, 8.75 $\mu^2$. The transistor elements Q2A–Q2E (referred to as Q2) are also constructed with the minimum emitter areas for low power dissipation. On the other hand, the transistor elements Q1A–Q1F (referred to as Q1) must be able to sink whatever the current source supplies as well as the current load of "n" output buffers. For example, the total bandgap load current may be as great as 3.1 mA with all n outputs high. Q1 is therefore sized so that it can sink between at least 0 and 3.1 mA.

Band gap circuit analysis of the circuit of FIG. 5 is based upon the condition that the circuit is temperature compensated (i.e. $dV_R/dT \cong 0$). With the emitter current density and emitter area design criteria for transistor elements Q1,Q2, and Q3 as selected above, approximate example resistor values are derived as indicated in FIG. 5. With the resistor values shown, there is no more than 40 mV variation in the reference voltage of each band gap bias generator BG1,BG2 over the desired operating temperature range of, for example, −55° C. to 175° C. The total variation in $V_R$ is therefore an acceptable 80 mV over this operating temperature range.

Further background on band gap bias generator circuit analysis can be found in the text *Analysis and Design of Analog Integrated circuits*, by Paul R. Gray and Robert G. Meyer, Second Edition, John Wiley & Sons, 1984. Particular reference is made to Chapter 4, "Transistor Current Sources and Active Loads", Section A4.3.2 on "Band Gap Referenced Biasing Circuits", pp 289–296 and Section 4.2.2 on "Widlar Current Source".

While the invention has been described with reference to particular example embodiments it is intended to cover all modifications and equivalents within the scope of the following claims.

I claim:

1. An improved TTL output buffer circuit having a pullup comprising at least one transistor (Q12A, Q12B) coupled to an output ($V_{OUT}$) for sourcing current from a high potential level power rail ($V_{CC}$) to the output ($V_{OUT}$) for transmitting high potential level output signals ($V_{OH}$) at the output ($V_{OUT}$) in response to TTL input signals propagating through internal nodes of a data signal propagating path of the output buffer circuit leading to a base node of the pullup, comprising:

a temperature compensated clamp reference voltage level circuit (BG1,BG2) providing a substantially stable clamp reference voltage level ($V_R$) over a specified range of operating temperatures, said clamp reference voltage level ($V_R$) being referenced to the low potential power rail (GND);

and a $V_{OH}$ clamp circuit comprising voltage drop components (D32, QC) coupling the clamp reference voltage level ($V_R$) through the voltage drop components (D32,QC) to an internal node (BDAR) of the output buffer circuit in said data signal propagating path, said $V_{OH}$ clamp circuit voltage drop components (D32,QC) defining a step up voltage drop from the clamp reference voltage level ($V_R$) to the internal node (BDAR) and said output buffer circuit defining a step down voltage drop from the internal node (BDAR) through the pullup (Q12A, Q12B) to the output ($V_{OUT}$), said clamp reference voltage level ($V_R$), step up voltage drop, and step down voltage drop being selected for clamping the high potential level output signal ($V_{OH}$) at the output ($V_{OUT}$) at a maximum voltage level ($V_{OHMAX}$) less than the high potential level power rail ($V_{CC}$), said maximum voltage level ($V_{OHMAX}$) being referenced to the clamp reference voltage level ($V_R$) through the step up and step down voltage drops.

2. The output buffer circuit of claim 1 wherein the temperature compensated clamp reference voltage level circuit comprises a band gap bias generator circuit (BG1,BG2) constructed to establish a substantially stable reference voltage level ($V_R$) approximately equal to said output signal maximum voltage level ($V_{OHMAX}$).

3. The output buffer circuit of claim 2 wherein the internal node of the output buffer circuit to which the $V_{OH}$ clamp circuit is coupled is a base node (BDAR) of the pullup (Q12A,Q12B) and wherein the $V_{OH}$ clamp circuit voltage drop components (D32,QC) establish a step up voltage drop approximately equal to the step down voltage drop across the pullup (Q12A,Q12B) between the base node (BDAR) of the pullup and the output ($V_{OUT}$).

4. The output buffer circuit of claim 1 wherein the internal node of the output buffer circuit to which the $V_{OH}$ clamp circuit is coupled is a base node (BDAR) of the pullup (Q12A, Q12B).

5. The output buffer circuit of claim 4 wherein the pullup comprises a pair of transistors coupled in Darlington configuration, said Darlington configuration transistor pair presenting a voltage drop of approximately $2\phi$ between the base node of the pullup and the output ($V_{OUT}$), where $\phi$ is a pn junction voltage drop.

6. The output buffer circuit of claim 5 wherein the temperature compensated reference voltage level circuit comprises a band gap bias generator circuit having a plurality of band gap bias generators (BG1,BG2) coupled in series generating in sum a substantially stable reference clamp voltage ($V_R$) approximately equal to the output signal maximum voltage level ($V_{OHMAX}$).

7. The output buffer circuit of claim 5 wherein the $V_{OH}$ clamp circuit comprises voltage drop components presenting a voltage drop of approximately $2\phi$ between the base node (BDAR) of the pullup and the band gap bias generator circuit so that the clamp voltage level at the base node (BDAR) of the pullup is approximately $V_R + 2\phi$.

8. The output buffer circuit of claim 7 comprising a phase splitter transistor element (Q10) having a collector node coupled to the base node (BDAR) of the pullup, a feedback transistor element (Q11) having collector and emitter nodes coupled respectively between the output ($V_{OUT}$) of the output buffer circuit and the collector node of the phase splitter transistor element (Q10), and a feedback clamp circuit comprising at least one voltage drop component coupling a base node of the feedback transistor element (Q10) to the band gap bias generator circuit (BG1,BG2) establishing a feedback clamp voltage level ($V_R + V_{SD}$) at the base node of the feedback transistor element (Q11) less than the clamp voltage level ($V_R + 2\phi$) at the base node (BDAR) of the pullup (Q12A, Q12B).

9. The output buffer circuit of claim 4 wherein the $V_{OH}$ clamp circuit comprises voltage drop components (D32,QC) selected to establish at the base node of the pullup a pullup clamp voltage level of $V_R$ plus approximately the voltage drop presented by the pullup between the base node (BDAR) of the pullup (Q12A,Q12B) and the output ($V_{OUT}$).

10. The output buffer circuit of claim 9 wherein the band gap bias generator circuit comprises first and second band gap bias generators (BG1,BG2) coupled in series establishing a reference clamp voltage level $V_R$ approximately equal to $V_{OHMAX}$, wherein the $V_{OH}$ clamp circuit comprises voltage drop component elements (D32,QC) establishing a voltage drop of approximately $2\phi$, and wherein the pullup comprises a Darlington configuration transistor pair (Q12A, Q12B).

11. The output buffer circuit of claim 4 further comprising a pseudorail circuit coupled between the base node of the phase splitter transistor element and the high potential power rail ($V_{CC}$) for sourcing current.

12. An improved TTL output buffer circuit having an input ($V_{IN}$) for receiving TTL input signals and an output ($V_{OUT}$) for transmitting logic high and low potential level output signals ($V_{OH}$, $V_{OL}$), pullup transistor element (Q12A, Q12B) coupled to the output for sourcing current to the output from a high potential power rail ($V_{CC}$) for transmitting high potential level output signals ($V_{OH}$) at the output ($V_{OUT}$) in response to TTL input signals propagating through internal nodes of a data signal propagating path of the output buffer circuit leading to a base node of the pullup transistor element, pulldown transistor element (Q13A, Q13B) coupled to the output for sinking current from the output to a low potential power rail (GND), and a phase splitter transistor element (Q10) coupled to internal nodes of the TTL output buffer circuit for controlling the conducting states of the pullup and pulldown transistor elements in opposite phase in response to said input signals, the improvement comprising:

a temperature compensated band gap bias generator circuit (BG1, BG2) providing a substantially stable clamp reference voltage level ($V_R$) over a specified range of operating temperatures, said stable clamp reference voltage level ($V_R$) being referenced to the low potential power rail (GND);

and a $V_{OH}$ clamp circuit comprising voltage drop components coupling the band gap bias generator circuit to an internal node of the TTL output buffer circuit in said data signal propagating path, said $V_{OH}$ clamp circuit voltage drop components (D32,QC) defining a step up voltage drop from the clamp reference voltage level ($V_R$) to the internal node (BDAR) and said output buffer circuit defining a step down voltage drop from the internal node (BDAR) through the pullup transistor element (Q12A,Q12B) to the output ($V_{OUT}$), said clamp reference voltage level ($V_R$), step up voltage drop, and step down voltage drop being selected for clamping the logic high potential level output signal ($V_{OH}$) at a maximum voltage level ($V_{OHMAX}$) less than the high potential power rail voltage level ($V_{CC}$), said maximum voltage level ($V_{OHMAX}$) being referenced to the stable clamp reference voltage level ($V_R$).

13. The output buffer circuit of claim 12 wherein the band gap bias generator circuit (BG1,BG2) is constructed to establish a substantially stable clamp reference voltage level ($V_R$) approximately equal to said output signal maximum voltage level ($V_{OHMAX}$).

14. The output buffer circuit of claim 13 wherein the band gap bias generator circuit comprises first and second band gap bias generators (BG1, BG2) coupled in series.

15. The output buffer circuit of claim 13 wherein the internal node of the output buffer circuit to which the $V_{OH}$ clamp circuit is coupled is a base node (BDAR) of the pullup transistor element (Q12A,Q12B) and wherein the $V_{OH}$ clamp circuit voltage drop components (D32,QC) establish a step up voltage drop approximately equal to the step down voltage drop across the pullup transistor element (Q12A,Q12B) between the base node (BDAR) of the pullup transistor element and the output ($V_{OUT}$).

16. The output buffer circuit of claim 12 wherein the band gap bias generator circuit comprises first and second band gap bias generators (BG1,BG2) coupled in series establishing a reference clamp voltage level $V_R$ approximately equal to $V_{OHMAX}$, wherein the $V_{OH}$ clamp circuit comprises voltage drop component elements (D32,QC) establishing a voltage drop of approximately $2\phi$, and wherein the pullup transistor element comprises a Darlington configuration transistor pair (Q12A, Q12B), said Darlington configuration transistor pair having a base node (BDAR), said $V_{OH}$ clamp circuit establishing a clamp voltage level of $V_{OHMAX}+2\phi$ at said base node (BDAR).

17. The output buffer circuit of claim 16 comprising a phase splitter transistor element (Q10) having a collector node coupled to the base node (BDAR) of the pullup transistor element, a feedback transistor element (Q11) having collector and emitter nodes coupled respectively between the output ($V_{OUT}$) of the output buffer circuit and the collector node of the phase splitter transistor element (Q10), and a feedback clamp circuit comprising at least one voltage drop component coupling a base node of the feedback transistor element (Q10) to the band gap bias generator circuit (BG1,BG2) establishing a feedback clamp voltage level ($V_F$) at the base node of the feedback transistor element (Q11) less than the clamp voltage level ($V_{OHMAX}+2\phi$) at the base node (BDAR) of the pullup transistor element (Q12A, Q12B).

18. An improved TTL output buffer circuit having an input ($V_{IN}$) for receiving TTL input signals and an output ($V_{OUT}$) for transmitting logic high and low potential level output signals ($V_{OH}$, $V_{OL}$), pullup transistor element comprising a pair of transistors (Q12A, Q12B) coupled in Darlington configuration to the output ($V_{OUT}$) for sourcing current to the output from a high potential power rail ($V_{CC}$) and for transmitting logic high potential level output signals ($V_{OH}$), pulldown transistor element (Q13A, Q13B) coupled to the output ($V_{OUT}$) for sinking current from the output to a low potential power rail (GND), and a phase splitter transistor element (Q10) having collector and emitter nodes coupled respectively to base nodes of the pullup and pulldown transistor means, said phase splitter transistor element (Q10) being coupled to the input for controlling the conducting states of the pullup and pulldown transistor elements in opposite phase in response to TTL input signals, the improvement comprising:

a temperature compensated band gap bias generator circuit comprising first and second band gap bias generators (BG1, BG2) coupled in series and providing in sum a substantially stable clamp reference voltage level ($V_R$) over a specified temperature operating range, said clamp reference voltage level ($V_R$) being referenced to the low potential power rail (GND) and being equal to a desired maximum voltage level ($V_{OHMAX}$) less than the high potential power rail ($V_{CC}$) for the high potential level output signal ($V_{OH}$);

and a $V_{OH}$ clamp circuit comprising voltage drop components (D32, QC) coupling the substantially stable clamp reference voltage level ($V_R$) through the voltage drop components (D32, QC) to the base node (BDAR) of the pullup transistor element, said voltage drop components providing a voltage drop of approximately $2\phi$ where $\phi$ is a pn junction voltage drop, said $V_{OH}$ clamp circuit establishing at the base node (BDAR) of the pullup transistor element a clamp voltage level ($V_R+2\phi$) for clamping the logic high potential level output signal ($V_{OH}$) at said maximum voltage level ($V_{OHMAX}$) less than the high potential power rail voltage level ($V_{CC}$).

19. The output buffer circuit of claim 18 comprising a feedback transistor element (Q11) having collector and emitter nodes coupled respectively between the output ($V_{OUT}$) of the output buffer circuit and the collector node of the phase splitter transistor element (Q10), and a feed back clamp circuit comprising at least one voltage drop component element coupling a base node of the feed back transistor element (Q10) to the band gap bias generator circuit (BG1,BG2) establishing a feed back clamp voltage level ($V_R+V_{SD}$) at the base node of the feed back transistor element less than the clamp voltage level ($V_R+2\phi$) at the base node (BDAR) of the pullup transistor element (Q12A, Q12B).

* * * * *